(12) United States Patent
Oglesbee

(10) Patent No.: US 6,340,878 B1
(45) Date of Patent: Jan. 22, 2002

(54) SILICON EQUIVALENT PTC CIRCUIT

(75) Inventor: John Wendell Oglesbee, Watkinsville, GA (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/692,576

(22) Filed: Oct. 19, 2000

Related U.S. Application Data

(60) Provisional application No. 60/161,191, filed on Oct. 22, 1999.

(51) Int. Cl.[7] .......................... H02J 7/04; H01M 10/44; H02H 5/04
(52) U.S. Cl. ....................................... 320/150; 361/103
(58) Field of Search ................. 320/134, 150, 320/153, 136; 361/103, 106

(56) References Cited

U.S. PATENT DOCUMENTS 4,255,698 A * 3/1981 Simon ......................... 320/134
4,973,936 A * 11/1990 Dimpault-Darcy et al. ... 338/32 R
5,703,463 A * 12/1997 Smith .......................... 320/134

* cited by examiner

Primary Examiner—Gregory J. Toatley, Jr.
(74) Attorney, Agent, or Firm—Philip H. Burrus, IV

(57) ABSTRACT

This invention is a series current regulator with an on-silicon temperature sensing means which forms an improved over current battery protection device. The invention regulates current in a pass element linearly while sensing the junction temperature of the pass element. If the temperature of the pass element reaches a predetermined threshold, the on-silicon temperature sensing means actuates a switch which causes the pass element to go into an open, or high-impedance, mode. The invention offers advantages over positive temperature coefficient (PTC) devices including smaller size, lower manufacturing defect incidents, improved performance, and improved circuit integration characteristics. The temperature response of a PTC can be exactly replicated with the present invention. Further, the invention offers advantages over PTC devices including faster trip time and lower leakage current.

15 Claims, 7 Drawing Sheets

SILICON EQUIVALENT PTC CIRCUIT

CROSS-REFERENCE TO RELATED APPLICATIONS

This application claims priority from U.S. Provisional Application Ser. No. 60/161,191, filed Oct. 22, 1999, the disclosures of which, including all attached documents and appendices, are incorporated by reference in their entirety for all purposes.

TECHNICAL FIELD

This invention relates generally to battery protection circuits. More specifically, this invention relates to thermal series protection circuits for rechargeable batteries.

BACKGROUND

Batteries, when placed in electronic devices like cellular phones, discharge at a controlled rate. For example, a lithium ion battery in a cellular phone may supply current, or discharge, at a rate of about half an ampere. This is analogous to pouring milk out of a jug at a nice, steady, even pace. The reason for this controlled discharge is that the phone's circuitry serves as a load on the battery, and uses the energy stored in the battery slowly. The discharge rate goes down as the impedance of the load goes up. The high impedance of the phone, and thus the slow energy usage, keeps the current drain limited to a controlled amount.

Occasionally, however, the positive and negative terminals of a battery can become shorted, which means that there is a load with very small impedance on the battery. When the impedance is very small, the current drain is very high. Imagine, for instance, carrying a battery in your pocket. If a piece of conductive metal, like a keychain, bracelet, paper clip, comes into contact with both the positive and negative terminals of the battery, a "short circuit", or very low impedance load, is created across the battery. When this occurs, the battery discharges at a very high current. The current is higher than is specified for the battery and thus cell life, performance, and reliability rapidly degrades. This battery killing situation is known as the "key chain" problem.

Rechargeable batteries can be expensive. As battery designers want to keep consumers happy, they want to prevent key chain problems from killing batteries, thereby saving consumers' money. Consequently, designers add "short circuit protection circuits" to rechargeable battery packs. These short circuit protection circuits are able to sense the level of current draining from the battery. When the current level gets higher than a specified limit, the short circuit protection circuit disconnects the battery from the external terminals.

A common device used to prevent a battery from discharging at high currents is a fuse. When a high current passes through a fuse, the conducting element in the fuse "burns up" or clears. For example, when three amperes flow through a one amp fuse, the fuse element burns and the fuse opens. In a battery pack this clearing serves to disconnect the battery from the terminals. The problem with a fuse, however, is that once the fuse clears, it can not be reset. Thus the battery is dead and can not be brought back to life.

Another common device used in short circuit protection circuits, which can reset itself, is a positive temperature coefficient, or PTC, device. A polymeric PTC is a device that protects circuits by going from a low impedance (high current) to a high impedance (low current) state in response to heat. A PTC is essentially two pieces of metal with a matrix of crystalline organic polymer containing conductive elements sandwiched in between. A PTC resembles a square Oreo® cookie, with metal plates as the cookie halves and crystalline polymer as the tasty cream filling. The active element in a PIC is the polymer, and it takes the form of a malleable goo much like the filling in an Oreo®. Under normal conditions, current flows from one cookie through the filling to the other cookie. Under short circuit conditions however, the high current flowing through the PTC causes the device to heat, which in turn causes the filling of the cookie to go into a high impedance state, thereby blocking current and effectively disconnecting the battery cell from the external terminals.

There are several problems associated with PTC devices when used as short circuit protection elements in battery packs. First and foremost, PTC devices are discrete parts that are large relative to other circuit components in battery packs. For example, a typical surface mounted PTC measures 0.374×0.264 inches. This can be fifty to a hundred times larger than other components. Designers like to keep battery circuits small, so large parts that take up a lot of room tend to make battery packs bigger.

Second, there are manufacturing problems associated with PTC devices. As stated above, a PTC is like an Oreo®, with metal plates as cookies and the polymer as the filling. In order for the PTC to work properly, the two metal plates, or cookies, must remain separated by the polymer, or filling. If a person or machine pinches the two plates together, the PTC becomes a short and no longer functions as a protection device. This occurs often in manufacturing.

Third, over-current protection circuit using PTC devices can not prevent high current discharge quickly. For example, in a short circuit protection circuit using a PTC device, some time is required for the device to heat causing the impedance to increase. Therefore, the abnormally high current continues to flow while the impedance of the device is increasing. In effect, damage may actually occur to the battery even though a PTC short circuit protection device is in place.

Due to the limitations of fuses and PTC devices listed above, there is a need for an improved short circuit protection device that can be manufactured in rechargeable battery packs.

DETAILED DESCRIPTION OF THE INVENTION

This invention is an improvement over prior art, series, current limiting devices like positive temperature coefficient devices (PTCs). This invention is a silicon series current regulator with temperature sensing and a thermal crowbar. It is a three terminal device comprising a linear current regulator coupled with an on-silicon junction temperature sensor and latch. The temperature sensor drives a state machine which opens the current regulator when it gets too hot.

Figure 1:
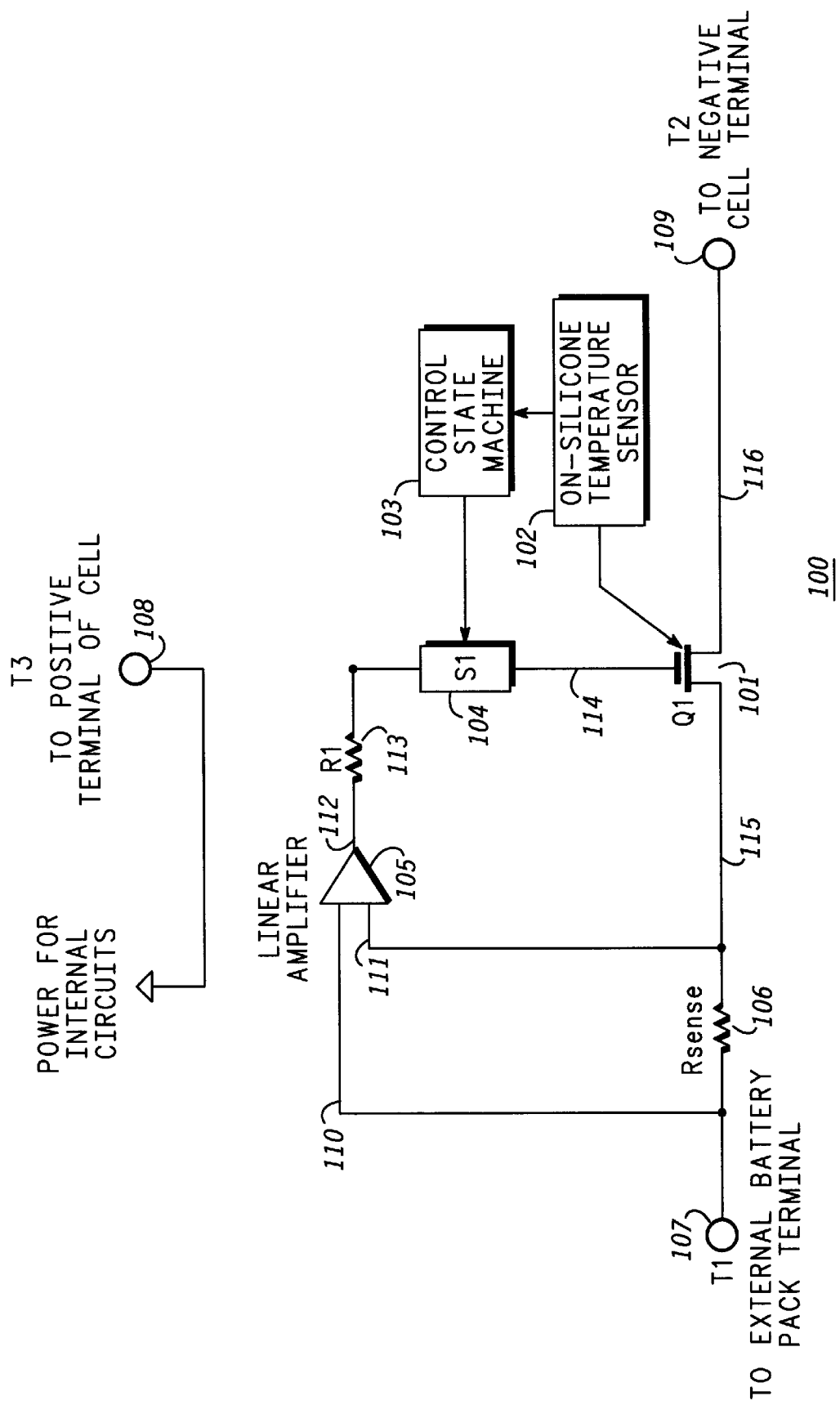
FIG. 1 is a schematic diagram of the present invention.

Referring now to FIG. 1, a preferred embodiment of the invention is illustrated therein. The invention 100 includes a pass element 101 which is shown as a n-channel field effect transistor (FET) having a gate 114, a source 116 and a drain 115. While a preferred embodiment of the pass element 101 is a FET, other devices, including bipolar junction transistors (BJTs), junction field effect transistors (JFETs), and the like will also suffice.

The pass element 101 is coupled in series with a current sense resistor 106 between a external terminal 107 and a negative cell terminal 109. A linear amplifier 105 is included with a first input 110 coupled to one side of the current sense resistor 106, and a second input 111 coupled to the other side of the current sense resistor 106. The output 112 of the linear amplifier 105 is coupled to the gate 114 of the pass element with an optional current limiting resistor 113, which is connected in series between the output 112 and the gate 114.

The circuit formed by the linear amplifier 105, the current sense resistor 106 and the pass element 101 forms a linear current regulator with feedback. The linear current regulator operates the pass element 101 in its linear, or ohmic, region by adjusting the series impedance of the pass element 101 in response to the voltage across the current sense resistor 106. In other words, current flows through the current sense resistor 106, which creates a voltage. The linear amplifier 105 senses the voltage across the current sense resistor 106 through the first and second inputs 110, 111. This sensed voltage is multiplied by the gain of the linear amplifier 105, which appears as a voltage at the output 112 of the linear amplifier. This voltage drives the gate 114 of the pass element 101. Thus, a linear feedback system is established which regulates the current flowing in the pass element 101.

An on-silicon temperature sensor 102 is thermally coupled to the pass element 101. The temperature sensor can be any one of several well known methods of sensing temperature on silicon. One example of such a method is the resistor temperature detector (RTD). A RTD is a device which may be manufactured using conventional silicon fabrication techniques which produces a voltage which is linearly proportional to temperature. RTD devices are used in semiconductor devices like the LM135 manufactured by National Semiconductor and the AD22100 manufactured by Analog Devices.

The on-silicon temperature sensor 102 is coupled to a control state machine 103 which, in turn, is coupled to a switch 104. The switch 104 is coupled in series between the gate 114 of the pass element and the output of the amplifier 112. The switch 104 may be any type of transistor, relay, regulator, amplifier, controller, diode or other functional equivalent.

The on-silicon temperature sensor 102, which is thermally coupled to the pass element 101, constantly senses the junction temperature of the pass element 101. When the temperature reaches a predetermined level, which may be stored in the control state machine 103, the control state machine 103 actuates the switch 104. The switch 104 is opened when the temperature reaches the predetermined level. When the switch 104 opens, the pass element 101 turns off, thereby blocking current to protect the pass element 101 from excessive temperature rise.

Figure 2:
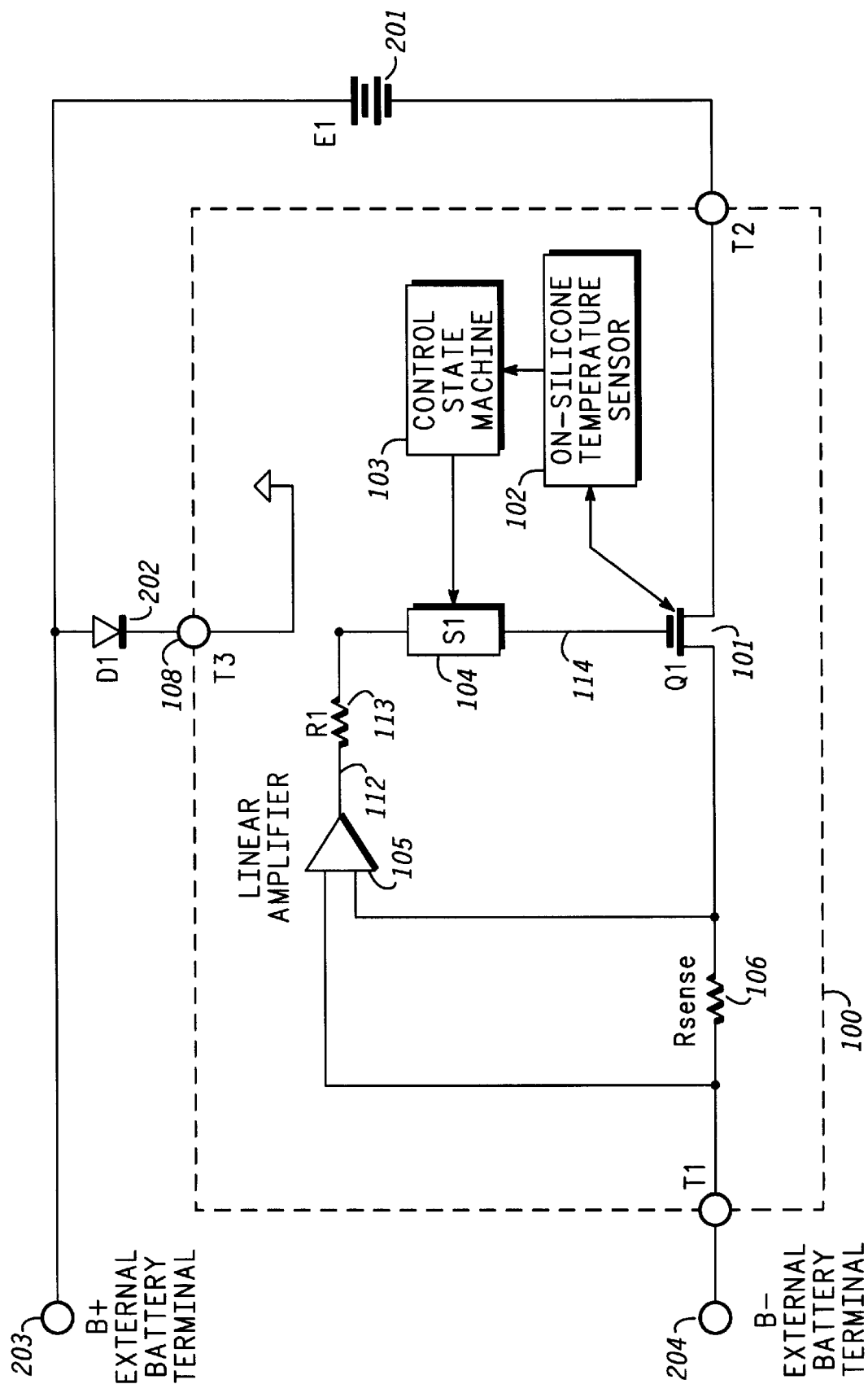
FIG. 2 is a schematic diagram of the present invention coupled to a battery to form a battery protection circuit.

Referring now to FIG. 2, illustrated therein is the invention 100 connected to a battery cell 201 and an optional blocking diode 202 to form a battery protection circuit. The cell 201 provides energy to both the invention 100 and external circuits. The optional blocking diode 202 ensures that current flows in only one direction, namely into the cell terminal 108 of the invention 100. The B+ external terminal 203 and the B− external terminal 204 are the external terminals of the battery pack and may be connected to external devices, chargers and power supplies.

Here's how the circuit 200 works: Under normal conditions, current flows from the B− external terminal 204, through the current sense resistor 106, through the pass element 101, through the cell 201, to the B+ external terminal 203. The linear amplifier 105 keeps the current in a controlled range. The pass element 101, operating normally, is below the threshold temperature and the switch 104 is closed, or fully "on".

Now, assume that an external fault, like a short circuit, occurs. For example, when a rechargeable battery is placed in a pocket, a key chain, bracelet or paper clip, which comes in contact with the external terminals can cause the terminals to short together. When the B+ external terminal 203 is shorted to the B− external terminal 204, the current supplied by the battery cell 201 dramatically increases. This increase in current causes an increase in the voltage across the current sense resistor 106, which causes the linear amplifier 105 to drive the pass element 101 into a high impedance mode.

The power dissipated in the pass element 101 is the product of the current squared times the impedance (also known as $I^2R$) of the pass element 101. Thus, under high current, high impedance conditions, the power dissipation in the pass element 101 increases, causing its internal temperature to rise. If the circuit 100 was left unchecked, the temperature of the pass element 101 would eventually become so high that it would literally burn.

However, the on-silicon temperature sensor 102 constantly monitors the junction temperature of the pass element 101. When the temperature gets to a predetermined level, which is below the thermal destruction temperature of the pass element 101, the control circuit 103 opens the switch 104. When the switch 104 is opened, the gate 114 of the pass element 101 is disconnected from the voltage of the output of the amplifier 112. In an n-channel FET, when the gate to source voltage decreases, the FET opens. In this circuit 100, when the switch 104 opens, the pass element 101 opens, thereby stopping the flow of current through the pass element 101. Thus, the battery cell 201 becomes disconnected from the B− battery terminal 204.

To recap the circuit operation, under normal conditions, current is flowing, the linear amplifier 105 is working, the junction temperature of the pass element 101 is cool and the switch 104 is closed. As the load impedance decreases, the linear amplifier 105 works to limit the current flow by causing the impedance of the pass element 101 to increase. Under overcurrent conditions, like a short, the pass element 101 begins to heat due to $I^2R_{ds}$ power dissipation. When the temperature reaches a predetermined level, the on-silicon thermal sensor 102 drives the control state machine 103 which opens the switch 104. When the switch 104 is opened, the pass element 101 opens, thereby disconnecting the battery cell 201 from the B− external terminal 204, thus entering a fail safe mode.

Figure 3:
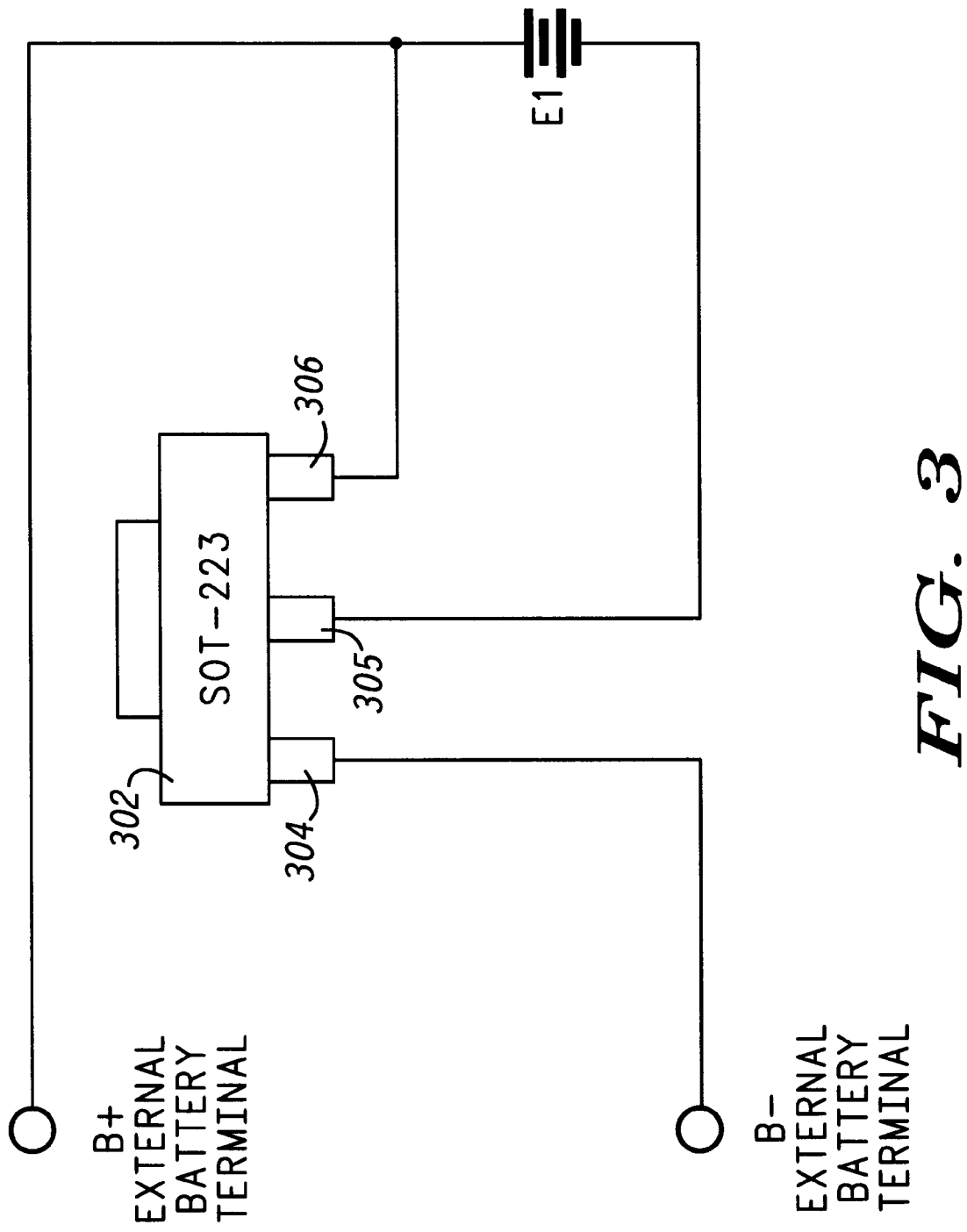
FIG. 3 is an embodiment of the present invention in packaged form, coupled to a battery to form a battery protection circuit.

The invention may be manufactured on a single monolithic silicon die which can be packaged in a standard semiconductor pack. Referring now to FIG. 3, one such embodiment is shown. Here, the die has been packaged in a SOT-223 package 302 with three terminals 304, 305, 306. These terminals correspond to terminals 107, 109, and 108 respectively. Notice that the optional blocking diode (202 of FIG. 2) has been integrated into the package. As the diode is a semiconductor itself, it is natural to incorporate it onto the die.

Figure 4:
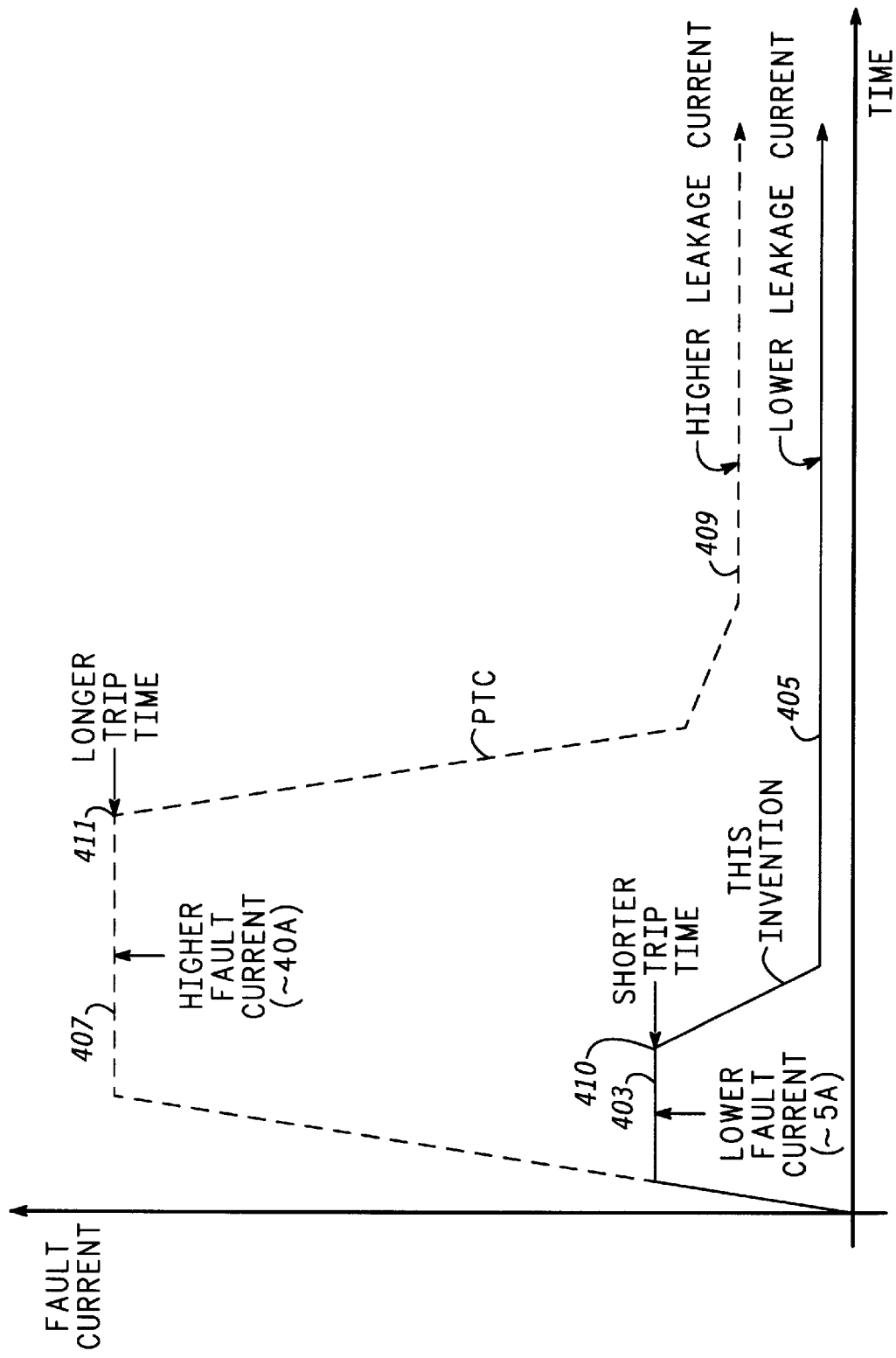
FIG. 4 is a comparison of the performance of the present invention with respect to a positive temperature coefficient device.

While this invention may appear similar to a conventional PTC, it has numerous features which make it a more desirable option for circuit designers. Referring now to FIG. 4, a graph comparing the transient response of a conventional PTC and the present invention is shown.

A PTC, which is constructed of metal plates, has a much larger thermal mass than does the present invention. A PTC thus heats more slowly than an on-silicon temperature sensor, which results in a slower trip time. This invention, with its smaller thermal mass, has a much faster trip time than a PTC. This can be seen by comparing point 410 to 411 in FIG. 4. Another characteristic is the trip current. A typical PTC fault current can be as much as eight times higher than that of this invention. Compare 403 to 407. A third difference is the leakage current. Experimental results show that the leakage current of a conventional PTC can be orders of magnitude higher that that of the present invention, as can be seen by comparing 405 to 409.

The invention as described thus far has been a linear current regulator with a thermal crowbar. The thermal crowbar has been a nonlinear latch, in that once the temperature reached a certain point, the pass element immediately opened due to the opening of the switch. It is not necessary, however, that the thermal crowbar operate in such a fashion. For example, the state machine could drive a linear feedback circuit to control the switch. Instead of immediately opening the switch, the device could slowly open the switch. The effect is that the current would slowly taper as opposed to abruptly stopping.

Figure 5:
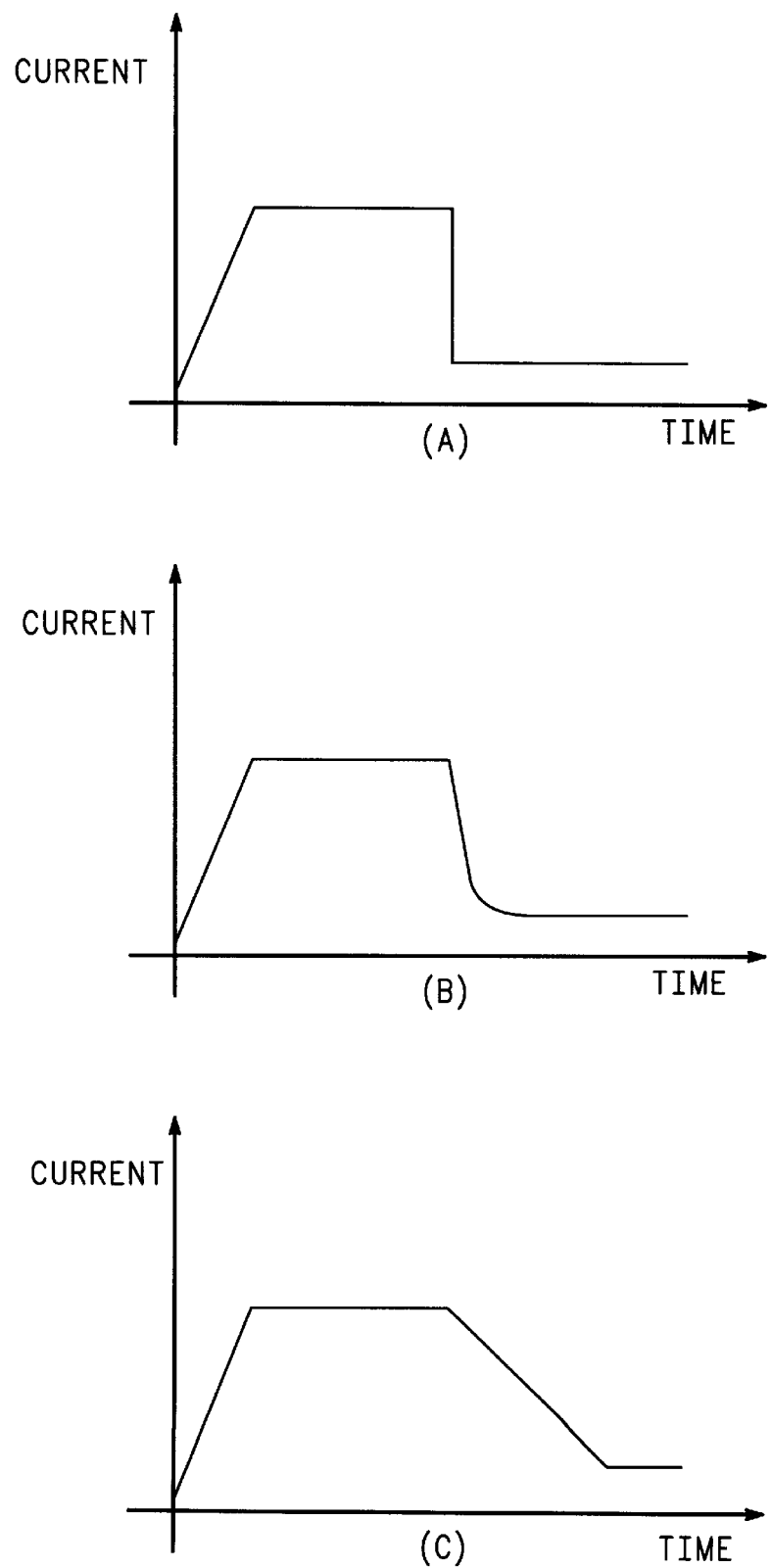
FIG. 5 illustrates different possible responses to fault currents in accordance with the present invention.

Referring now to FIG. 5, three different disconnect methods are illustrated therein. In (a), the non-linear, abrupt current stop is shown. Referring now to (b), an exponential current termination is shown. In (c), a linear current termination is shown. These could easily be achieved by adding a drive circuit between the control state machine and the switch. For example, to create an exponential termination, a simple R-C filter could be used. Alternatively, for a linear termination, the state machine could drive a linear feed back circuit. In any case, it is evident that the current termination can be tailored as circumstances require.

Figure 6:
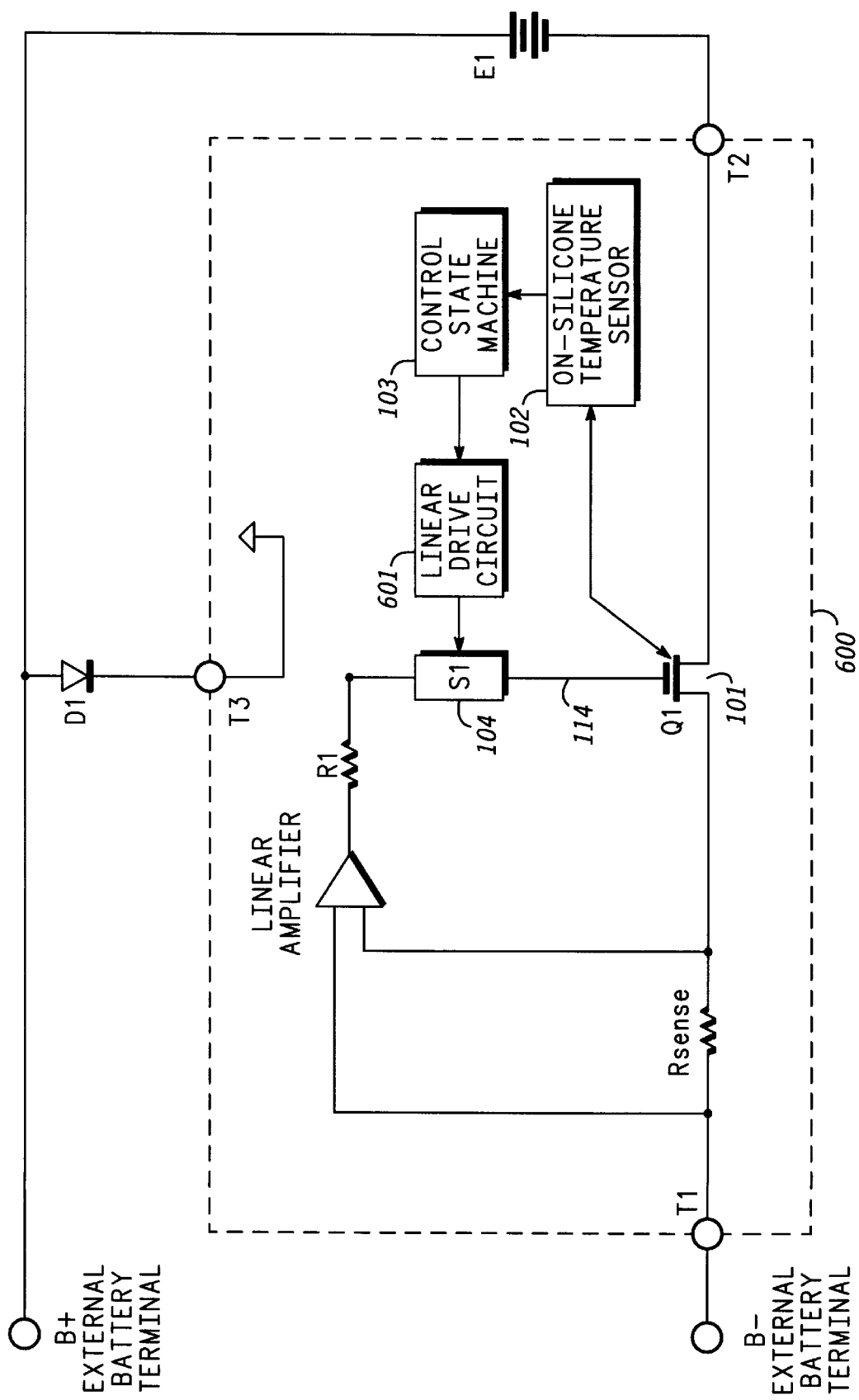
FIG. 6 is a schematic diagram of the invention with a linear drive circuit.

Referring now to FIG. 6, illustrated therein is a circuit for producing one type of linear current termination. The circuit 600 is identical to that of FIG. 2, except for the linear drive circuit 601 which has been coupled between the control state machine 103 and the switch 104. The linear drive circuit 601 allows the control state machine 103 to turn the switch 104 off slowly, thereby creating a linear termination of current in the pass element 101. This linear termination has a distinct advantage, in that it allows the invention to identically mimic the temperature response of a PTC device.

When the switch 104 is turned on or off abruptly, current flow in the pass element 101 starts and stops abruptly. When this happens, the temperature of the device begins changing. For example, if the circuit 600 is heating due to abnormally high current flow in the pass element 101, once the temperature reaches a predetermined threshold, the pass element 101 opens, stopping current flow. This makes the temperature decrease until it falls below the threshold. The current begins flowing again, causing temperature to rise again. While this can be desirable for some short term applications, extensive oscillation can weaken the semiconductor over long periods of time.

The circuit 600 with the linear drive circuit 601 overcomes this long term reliability concern. When abnormally high current begins flowing in the pass element 101, the linear drive circuit 601 slowly turns off the pass element 101. Note that a feedback loop is created by the switch 104 to pass element 101 to on-silicon temperature sensor 102 to control state machine 103 to linear drive circuit 601 to switch 104 circuit. This loop allows the control state machine 103 to equalize the power being generated by current flowing in the pass element 101 with power dissipation of the pass element 101 externally. Thus the on again/off again flip flop of a non-linearly controlled switch is eliminated. For this condition, the heat flow in and out of the pass element 101 is balanced, and the temperature remains relatively constant. Further, the circuit thereby exactly emulates the performance of a PTC!

Figure 7:
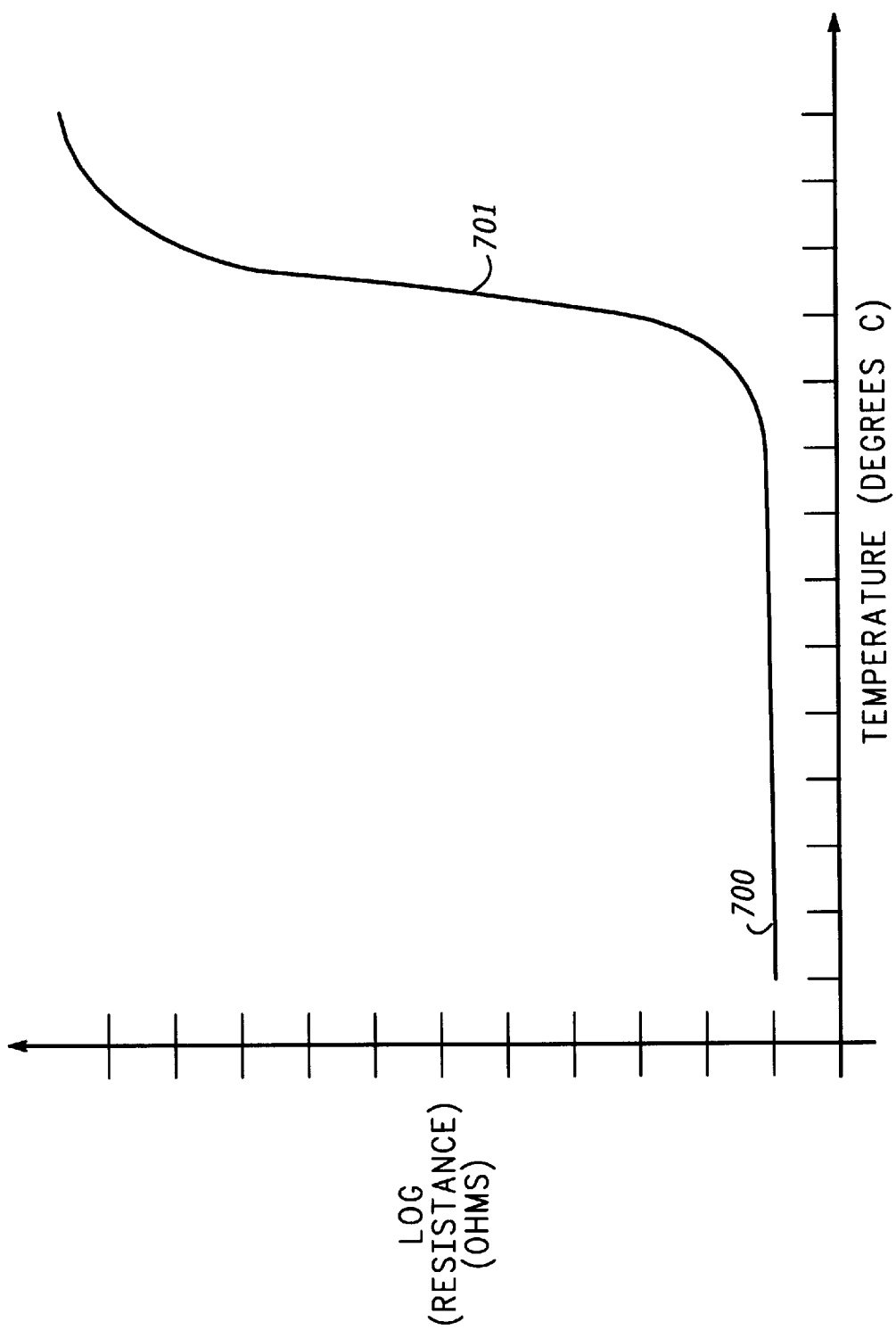
FIG. 7 is a temperature response for a PTC and the present invention.

Referring now to FIG. 7, the characteristic temperature performance of both the present invention and a PTC device is shown. PTC operation is dependent upon a similar heat flow balance for the pass element 101. In other words, the energy being dissipated by the metal plates of the device must equal the energy that is being generated by the $I^2R$ relationship for the PTC. Any heat that is not lost externally makes the device get hotter.

When the device is operating normally, the current through the device is low. A low current creates little $I^2R$ heating. The small amount of heat is thus easily dissipated into the atmosphere, causing the equivalent resistance of the PTC to remain low. This is shown at point 700 in FIG. 7.

When the current flowing through the PTC gets sufficiently high, the heat generated by the $I^2R$ heating increases at a rate which is greater than that which can be immediately dissipated. This causes a rapid increase in the temperature of the PTC, which makes its resistance increase rapidly per temperature change. Thus, the PTC device rapidly goes from low impedance to high impedance as small increases in temperature occur. This is shown at point 701 in FIG. 7. Thus, the impedance characteristic of the device moves back and forth along the curve until device temperature and dissipation to the environment are equal. This conventional operation of the PTC is known, but is reprised here for comparison to this invention.

This invention, when the switch is driven by a linear circuit in response to the feedback loop discussed in reference to FIG. 6, exactly mimics the response of a PTC. The feedback loop allows continuous linear adjustment the impedance of the pass element 101 to exactly balance with the power dissipation of pass element 101 with heat flows to the environment. This balanced condition is sensed by the temperature changes of the pass element 101. Therefore, as opposed to the on again/off again performance associated with the non-linear switch (see FIG. 2) is replaced by a continuous linear operation driven by the feedback loop to exactly match the performance of a PTC. (Linear is used herein to mean a circuit in which the output responds to changes in the input.)

The next question is why match the performance of a PTC with a silicon equivalent! There are numerous advantages. First and foremost, a silicon equivalent is less expensive to manufacture. Second, a silicon equivalent can be easily integrated into numerous devices including application specific integrated circuits (ASICs), power semiconductors, and battery protection circuits. Third, the design of the silicon equivalent is much more flexible in that numerous response curves may be generated with the same architecture. Fourth, there is a reduction of board space when incorporating the silicon equivalent into a circuit. Fifth, the silicon equivalent is more conducive to automated manufacture than is a PTC. Sixth, the silicon equivalent can be designed with better performance characteristics, including lower fault current, faster trip time, lower leakage current and better reset characteristics.

While the preferred embodiments of the invention have been illustrated and described, it is clear that the invention is not so limited. Numerous modifications, changes, variations, substitutions, and equivalents will occur to those skilled in the art without departing from the spirit and scope of the present invention as defined by the following claims. For example, while the invention has been described as a battery protection circuit, the invention could easily be incorporated into power transistors as a protection device. The transistor itself would serve as the pass element, and the on-silicon temperature sensor could protect the device from thermal destruction by opening the transistor when its junction temperature reached excessive levels.

What is claimed is:

1. A protection circuit for rechargeable batteries, comprising a silicon equivalent positive temperature coefficient device, the silicon equivalent positive temperature coefficient comprising:
   at least three terminals;
   a pass element coupled between a first terminal and a second terminal;
   a first control circuit coupled to the pass element for regulating the impedance of the pass element; and
   an on-silicon temperature sensor thermally coupled to the pass element;
   wherein the on-silicon temperature sensor monitors the temperature of the pass element.

2. A protection circuit as in claim 1, further comprising:
   a current sense element coupled in series with the pass element;
   a second control circuit coupled to the on-silicon temperature sensor; and
   a variable control device coupled which is activated by the second control circuit,
   the variable control device being coupled between the pass element and the first control circuit.

3. The protection circuit of claim 2, further wherein when the temperature of the pass element reaches a predetermined threshold, the second control circuit activates the variable control device.

4. The protection circuit of claim 3, further wherein the activation of the variable control device is in response to a thermal feedback control circuit.

5. The protection circuit of claim 4, further wherein the pass element comprises a transistor.

6. The protection circuit of claim 5, further wherein the variable control device is selected from the group consisting of a transistor, amplifier, diode, switch and relay.

7. The protection circuit of claim 6, further wherein the pass element comprises a metal oxide field effect transistor (MOSFET).

8. The protection circuit of claim 6, further wherein the pass element comprises a bipolar junction transistor (BJT).

9. The protection circuit of claim 6, further comprising a battery cell having a positive and a negative terminal, wherein the positive terminal of the battery cell is coupled to the third terminal of the circuit, and the negative terminal of the battery cell is coupled to the second terminal of the circuit.

10. The protection circuit of claim 9, further comprising a blocking diode, wherein the cathode of the blocking diode is coupled in series between the battery cell and the third terminal, with the anode connected towards the battery cell and the cathode is connected towards the third terminal of the circuit.

11. The circuit of claim 10, further wherein the control circuit comprises a state machine.

12. The circuit of claim 11, further wherein the variable control device is activated by a linear drive circuit.

13. A method of protecting rechargeable batteries, the method comprising the steps of:
   providing a series pass element;
   providing a current sense means;
   providing a current regulations means
   providing a temperature sensing means;
   providing a variable control device with control means; and
   providing a predetermined threshold temperature;
   wherein the linear current regulation means regulates current through the series pass element until the temperature reaches the predetermined threshold, upon which the temperature sensing means alerts the control means which activates the variable control device; further wherein when the variable control device is activated the series impedance of the pass element increases with increasing temperature.

14. The method of claim 13, further providing a battery cell.

15. The method of claim 14, further wherein when the pass element decreases current.

* * * * *